United States Patent [19]

Petschauer et al.

[11] Patent Number: 4,899,311

[45] Date of Patent: Feb. 6, 1990

[54] CLAMPING SENSE AMPLIFIER FOR BIPOLAR RAM

[75] Inventors: Richard J. Petschauer, Edina; Robert J. Bergman, Roseville, both of Minn.

[73] Assignee: Unisys Corporation, Blue Bell, Pa.

[21] Appl. No.: 237,470

[22] Filed: Aug. 29, 1988

[51] Int. Cl.$^4$ .................................................. G11C 7/00
[52] U.S. Cl. ................................ 365/189.06; 365/155; 365/179
[58] Field of Search ................... 365/189.06, 174, 155, 365/241, 154, 208, 179

[56] References Cited

U.S. PATENT DOCUMENTS 4,464,735 8/1984 Toyada et al. ...................... 365/155

Primary Examiner—James W. Moffitt
Attorney, Agent, or Firm—Glenn W. Bowen; Robert S. Bramson

[57] ABSTRACT

A sense amplifier is provided for a bipolar random access memory that has memory cells arranged in a column and a pair of bit lines for said column of memory cells. A first bipolar transistor has its collector-emitter path coupled to one of the bit lines of a pair, and a base coupled through a diode means to the second bit line. A second bipolar transistor has its collector-emitter path coupled to the second bit line and its base coupled through a second diode to the first bit line. The collectors of both of the bipolar transistors are coupled to provide an output signal. Resistors are coupled to a pulse source and to both of the bases of the bipolar transistors. A current sink is coupled to both of the select bit lines. The diode means are connected so as to be forward biased when the base-emitter junction of the transistor to which the diode means is coupled is also forward biased.

12 Claims, 6 Drawing Sheets

CLAMPING SENSE AMPLIFIER FOR BIPOLAR RAM

BACKGROUND OF THE INVENTION

1. Field of the Invention. The present invention relates to clamping sense amplifiers for bipolar Random Access Memories (RAM) which prevent the lower potential, or most negative, bit line from going to too low a level during a "read" operation, since this could cause the selected cell to be written falsely.

2. Background Art

In conventional designs, a separate switchable clamp voltage is used to prevent the lower potential bit line from going too far negative. However, it is difficult to match this voltage with all the cells in the array. If the clamp voltage is too high on a given cell no output, or a weak output, will be is sensed. If the clamp voltage is too low false writing in a cell may occur. The clamping sense amplifier of the present invention does not require a separately controlled voltage for the RAM, since a clamp voltage referenced to itself is generated and used separately by each cell.

The conventional way to build a Bipolar Memory(-RAM) cell is shown in FIG. 1. It consists of a cross coupled latch with load impedance, Z, to develop a voltage swing, dual emitter transistors with one pair connected together, and the other two connected to bit lines for reading and writing, pull down currents to discharge the bit lines, a current source for the cell, and a point for connecting to the Row Select line. The load impedance circuit, Z, can be either a resistor, a Schottky diode, or a network combining the two, or PNP transistors. The current source may be shared with the other memory cells connected to the same row driver.

A memory cell may be one which is sensed and written on a single pair of bit lines by use of extra emitters on the cell transistors. Since the emitters on the cell transistors can only charge the bit lines positive, a negative current is needed to discharge the bit line and distinguish between a high and low emitter. For a fast read access time, this negative current must be great enough to discharge the rather large capacitance on the bit line in a short time, and it usually is larger than the memory cell current which is kept low to minimize total power. It is also possible to switch this negative current to only the digit line to be selected for a read or write operation. Since this discharge current is larger than the cell current, if not properly controlled, it can write into a selected cell during a read operation, causing erroneous operation.

In conventional designs, this is prevented by applying a clamp voltage on the bit lines which prevents them from going too negative. This clamp voltage must be accurately controlled to be somewhere between the high and low levels of the two emitters, which are determined by the storage of a 1 or 0 in the cell. Also, the clamp voltage must be switched off during a write cycle. Due to the voltage drops on the Row line, component variations, etc., it is difficult to generate an accurate clamp voltage. Furthermore, when a given cell is selected by the raising of its Row line, no sense or read current can be observed until the cell output emitter voltage exceeds the clamp voltage, thereby increasing the read access time.

BRIEF DESCRIPTION OF THE DRAWINGS

The present invention is illustrated by reference to the drawings in which.

SUMMARY OF THE INVENTION

The purpose of this invention is to eliminate the need for a separately generated and distributed bit line clamp voltage by using the cell voltage itself to control a combination clamping sense amplifier which does the same function. A further purpose is to initiate the sense amplifier output signal sooner since no voltage threshold needs to be overcome.

The clamping sense amplifier prevents the lower (or most negative) bit line from becoming too low during a "read" operation since this could cause the selected cell to be written falsely. In conventional designs, a separate switchable clamp voltage is used for this. However, it is difficult to match this voltage with all the cells in the array. If the clamp voltage is too high no output (or a weak output) is sensed. If it is too low false writing may occur. The advantage of the clamping sense amplifier described here is that no separately controlled voltage is needed since a clamp voltage is generated and used separately by each cell referenced to itself.

DESCRIPTION OF THE INVENTION

Figure 1:
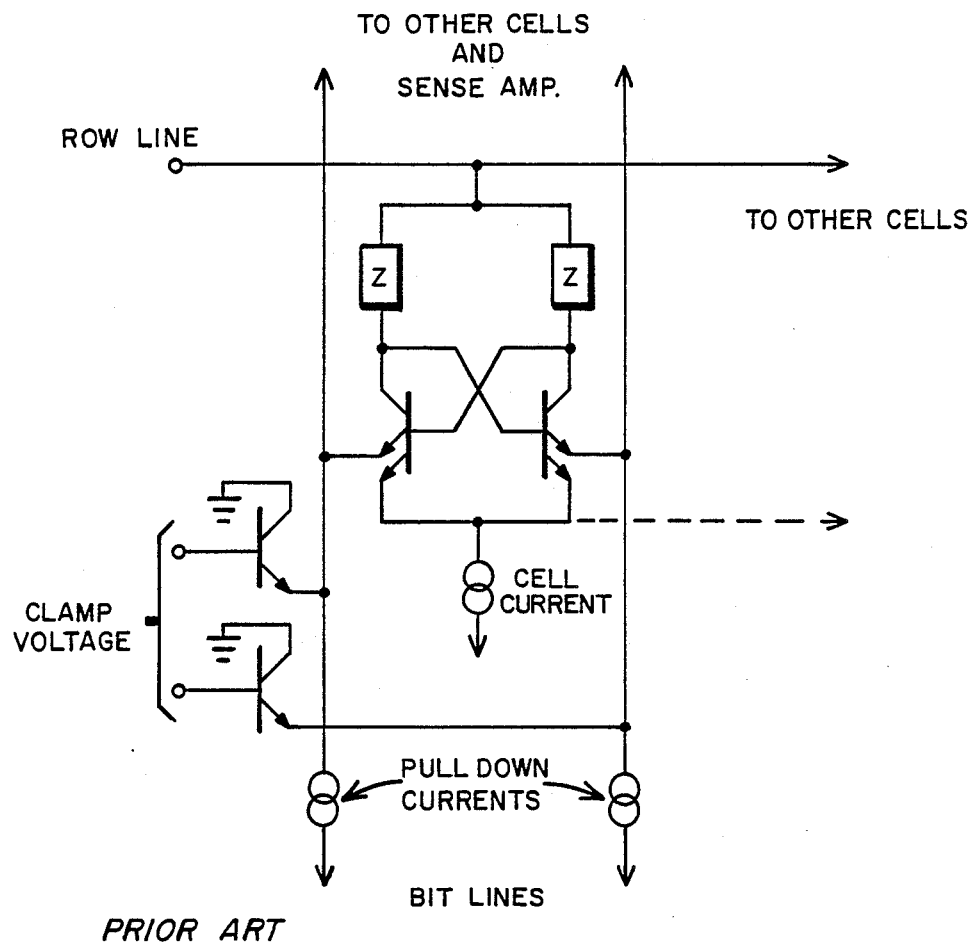
FIG. 1 represents a conventional memory cell with bit line clamp voltages.
Figure 2:
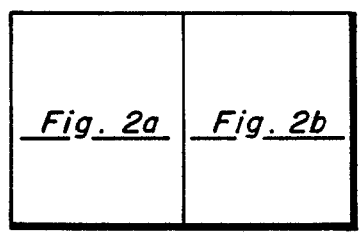
FIGS. 2a and 2b are a schematic of the present invention in a semiconductor memory embodiment.
Figure 3:
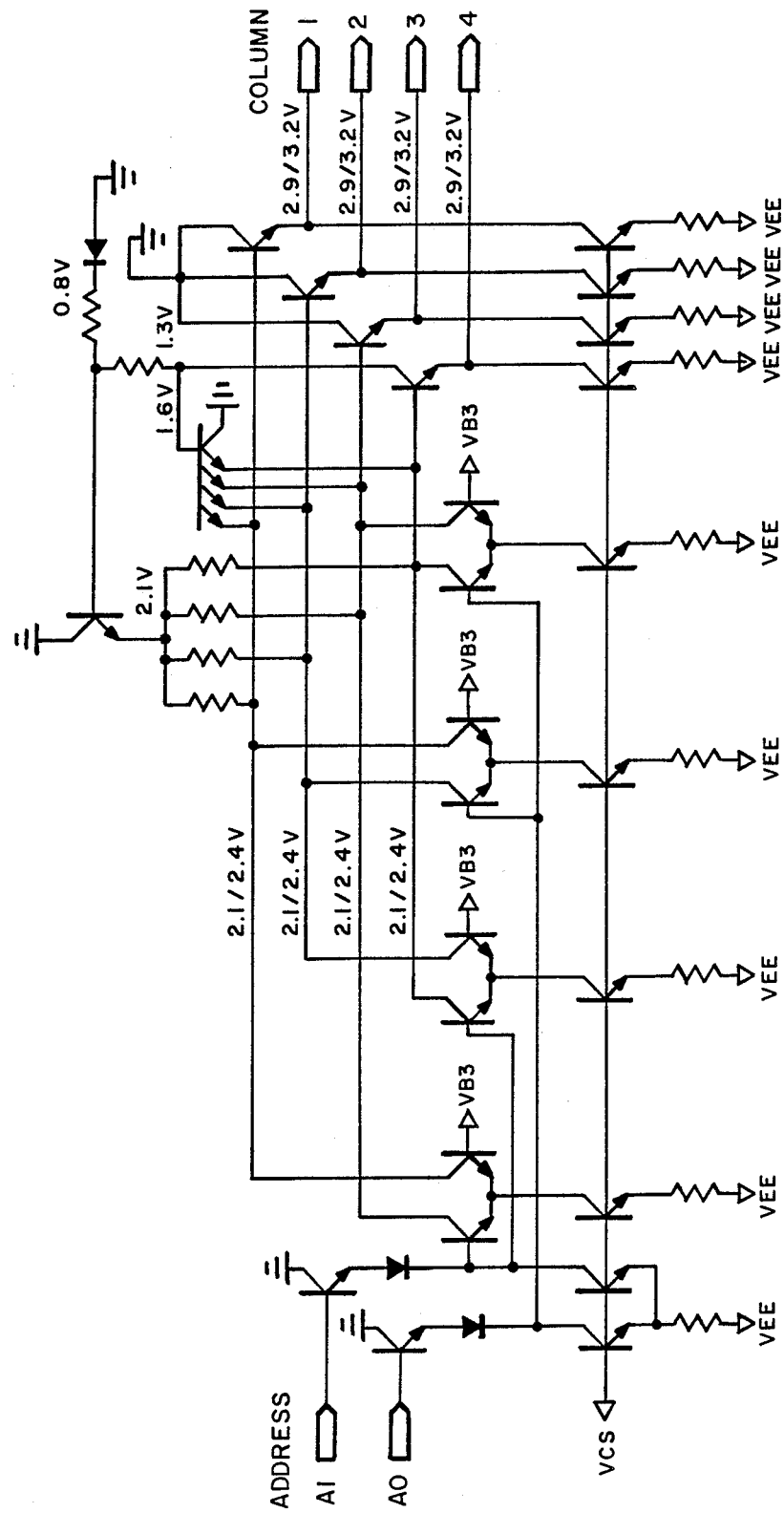
FIG. 3 is a schematic of a column selector for the memory of FIGS. 2a and 2b.
Figure 4:
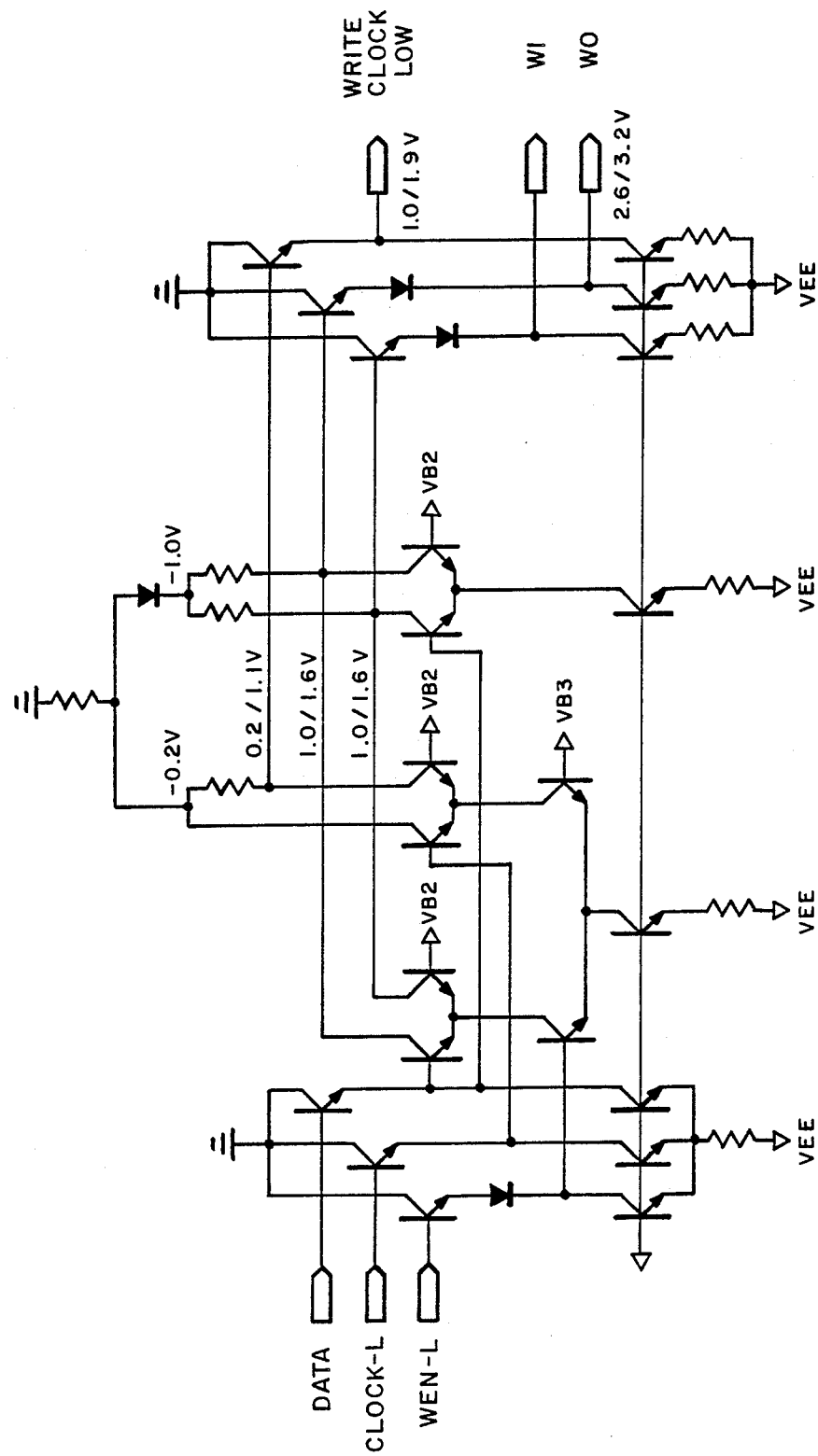
FIG. 4 is a schematic of write-control circuitry for the memory of FIGS. 2a and 2b.

FIGS. 2-4 show the diagram of a memory system and associated circuitry, which employs the preferred embodiment of the invention. 8 memory cells are arranged in 2 rows and 4 columns constituting 8 words each having 1 Bit of stored data. Row 1 is selected by driving its row line high to about $-1$ volt. Column 1 is also selected by turning on dual emitter transistors Q5 and Q6 with a signal from the column selector circuit (FIG. 3). When Q5 and Q6 are on, current sources $I_1$ and $I_2$ are diverted down Bit lines B1 and B2, which tends to pull these lines more negative in potential.

It may now be assumed that a selected cell, such as typical cell A, has a stored state which puts the emitter of Q1 that is connected to Bit line B1 high and the emitter of Q2 that is connected to the Bit line B2 low. For reading, the common points of resistors R4 and R5 that are connected to the Write Clock line are held high by the WRITE CLOCK output of the Write Drive circuit of FIG. 4 which causes diodes D3 and D4 to conduct. The differential voltage between lines B1 and B2 then causes Q3 to turn on, and Q4 to turn off. When this occurs transistor Q3 provides most of the current for Bit line B2, with the rest of the current coming from D4. When this current flows through Q6, the voltage of Bit line B2 is held close to the voltage of line B1. This biases the emitter of Q2 off, and insures it will not conduct current and change its state.

The collectors of Q3 and Q4 follow the signal on the bit lines delayed by about 0.75 nsec. The lower potential bit line is clamped about 60 MV below the higher potential bit line. The "ON" transistor Q3 or Q4 has about 810 MV, across the base-emitter junction (VBE), while the off transistor has about 690 MV VBE. This 120 MV difference insures one of the transistors Q3 and Q4 is on while the other is off.

The diodes D3 and D4 may be made from transistors with each collector tied to its base. The voltage difference between Bit line B1 and Bit line B2 is about 60 MV, whereas a typical cell voltage swing is about 400 MV. Thus only 340 MV is applied across the emitter of Q2, which is much less than the 800 MV needed to turn it on. This 60 MV difference can be increased by making diodes 3 and 4 from larger transistors by using Schottky diodes, or by adding small resistors in series with each emitter of transistors Q3 and Q4. The memory cell shown here uses a transistor clamp, QC1, but Schottky diodes in parallel with resistors R1 and R2 could be used instead for clamping, in which case R3 could be shorted out.

The collectors of all the Q3 and Q4 transistors in the sense amplifier sections for the 4 columns can be tied together to resistors R6 and R7, and the voltages at these points can then be used to provide the data output signal. This technique saves power since the same current that discharges the bit line can be used by the sense amplifier. If the opposite state in the cell is stored, transistor Q4 will conduct and transistor Q3 would be off.

Assuming it is desired to write the opposite state into the same selected cell, writing is accomplished as follows: Row 1 will be driven high and Column 1 will be selected by turning on Q5 and Q6. When writing in a cell as desired, the base of Q32 is driven higher than the base of Q5 thereby causing current $I_2$ to be supplied from the source of signal W1, (the circuit of FIG. 4), which turns off the current in Bit line B1. The base of Q31 is left low by signal W0 so that Q6 continues to draw current $I_1$, but Q3 will continue to provide this current.

To initiate writing, the enabled WRITE CLOCK from the circuit of FIG. 4, goes low. This ensures that both transistors Q3 and Q4 are off, and diodes D3 and D4 are reversed biased, thereby turning off the clamping action. At this time Bit line B2 must provide the current to transistor Q6, which pulls Bit line B2 negative. Shortly thereafter writing begins in the conventional manner.

The emitter of transistor Q2 begins to conduct pulling current through resistor R2 which lowers the base voltage of Q1, thereby turning it off. When Q1 is off the voltage of the base of Q2 rises, which turns it on harder, thus causing the cell to store the opposite state. Transistor QC1 clamps the collector of Q2 preventing it from saturating. Writing is now completed and the WRITE CLOCK goes high, which turns the clamping sense amplifier circuit back on.

The purpose of current sinks $I_3-I_6$ is to provide a small trickle current through the emitters of Q3 and Q4 when they are in a sense amplifier that has not been selected. This prevents the Bit lines B1 and B2 from drifting up to the high WRITE CLOCK level through the resistors, such as R4 and R5, etc. Such drift would increase the access time if a column had not been selected for a long time. The emitters of Q3 and Q4, when not selected, conduct a slight current that maintains their voltage at about 0.8 volt below the high write clock level. Reverse leakage current through all the cell emitters connected to the bit lines may be sufficient for this purpose, in which case current sinks $I_3-I_6$ could be eliminated.

Figure 2A:
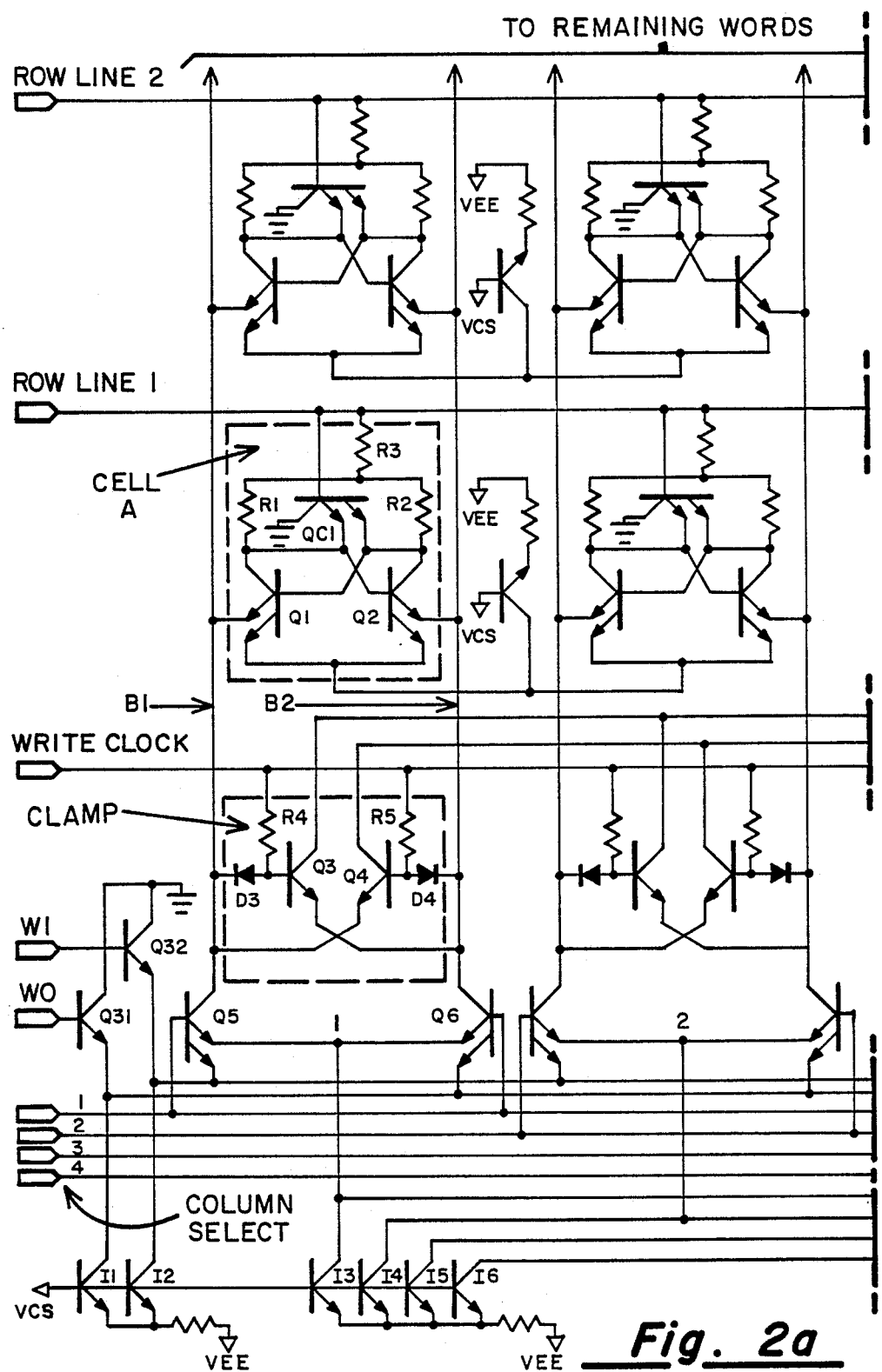
Figure 2B:
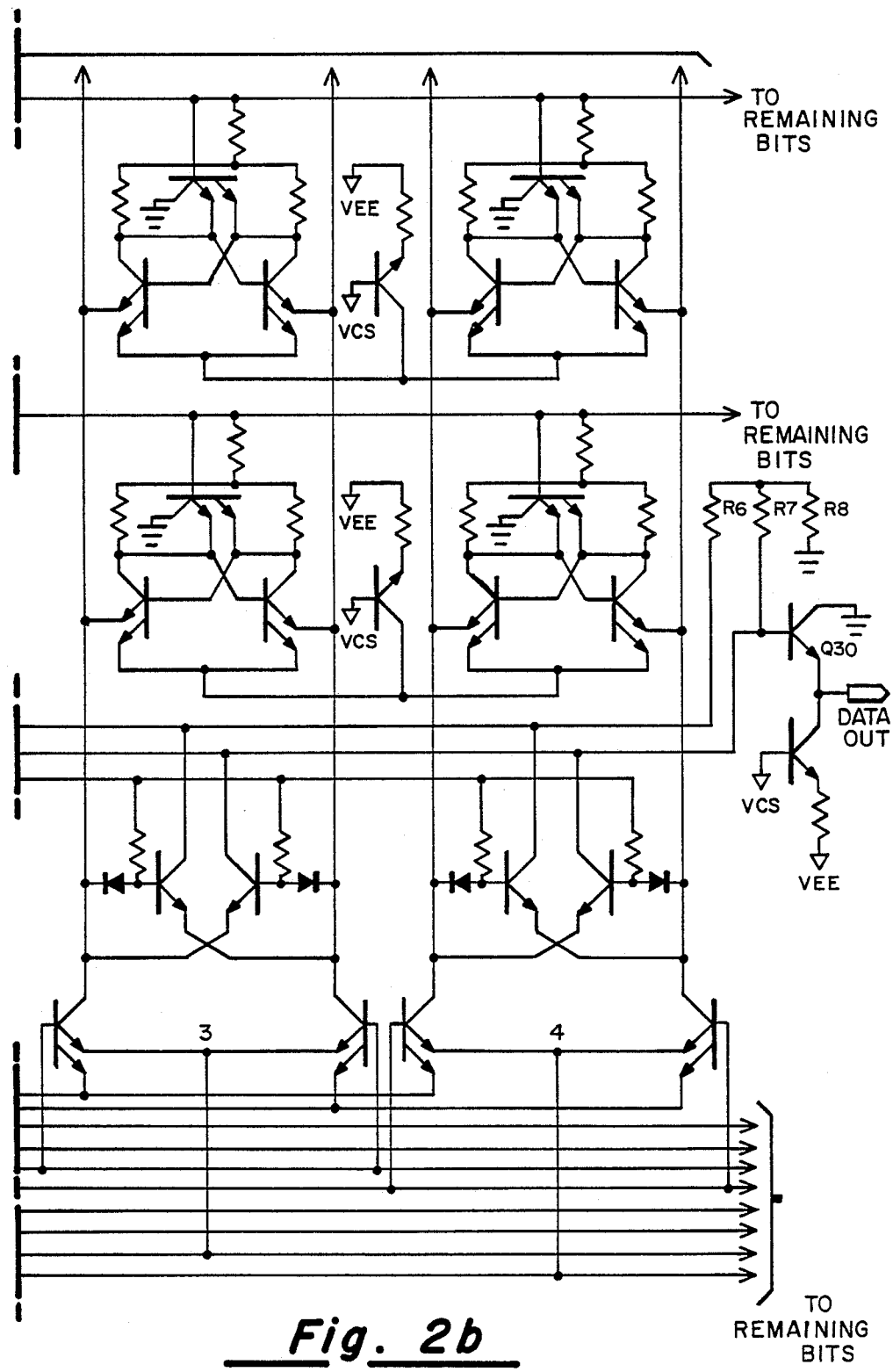
Figure 5:
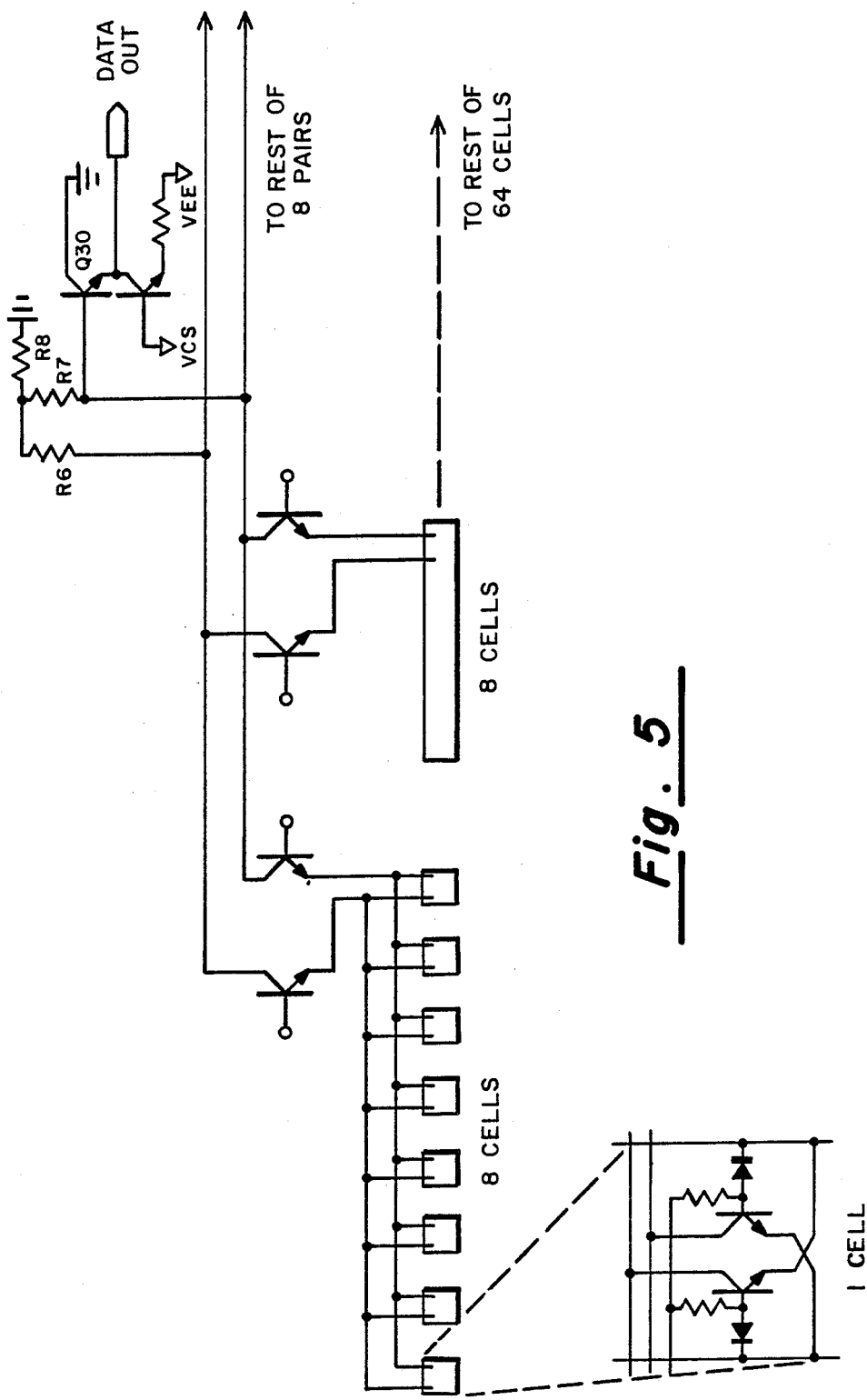
FIG. 5 is a schematic which shows how the embodiment can be expanded to a larger number of bit lines.

The embodiment described here has 4 digit lines, one of which is selected for the output. In some memory organizations one from a larger number, perhaps 64, must be selected. In this case the capacitance of 64 collectors of transistors Q3 and Q4 of the 64 cells and the associated wiring connecting them may be so large as to slow the read access time. In this case, the same techniques as used in conventional memory designs could be used. That is, the 64 cells could be broken down, for example, into 8 groups each containing 8 cells as shown in FIG. 5. In each group the respective collectors of the Q3 and Q4 transistors would be connected together. These would then connect to the emitters of a pair of additional transistors that are added. The bases of these two transistors would be at such a voltage to allow the transistors to conduct. From all the groups the collectors of these pairs of transistors would then be connected together and the resistors R6, R7, R8 of FIGS. 2a and 2b would be connected at these points and Transistor Q30 could then provide the Data Out signal.

We claim:

1. In a bipolar random access memory comprising a plurality of memory cells, a plurality of select word lines and a plurality of pairs of select bit lines coupled to said memory cells, and an output driver, the improvement comprising first and second clamping means, a plurality of sense amplifier means each comprising first and second bipolar transistor means each of which comprise a collector-emitter current path and a gate means for controlling current flow in its associated collector-emitter path, wherein both of said collector-emitter paths are coupled between said output driver and a different select bit line of the same pair of said plurality of pairs of said bit lines, and said gate means of said bipolar transistor means has its collector-emitter path coupled to a first one of said select bit lines of said pair of bit lines through said first clamping means to the second one of said select bit lines of said pair of bit lines, and said gate means of said other bipolar transistor has its collector-emitter path coupled to said second one of said pair of said select bit lines through said second clamping means to said first one of said select bit lines.

2. In a bipolar random access memory as claimed in claim 1 the improvement wherein said first and second clamping means comprise diode means.

3. In a bipolar random access memory as claimed in claim 1, the improvement comprising current sink means coupled to receive current flowing in said select bit lines, bipolar select bit transistor means for each select bit line each of which comprises a first collector-emitter path coupled in series with one of said collector-emitter paths of said first and second bipolar transistors of said sense amplifier means to said current sink means and a second collector-emitter path coupled to one of two write select lines, first write means capable of writing a logical "1" into a selected memory cell means coupled to one of said write select lines and second write means capable of writing a logical "0" into a selected memory cell coupled to the other of said write select lines.

4. In a bipolar random access memory as claimed in claim 3 the improvement wherein said first and second clamping means comprise diode means.

5. In a bipolar random access memory as claimed in claim 1, the improvement comprising write clock means for coupling a signal to both of said gate means of said first and second bipolar transistor means of said sense amplifier means, and first write means comprises a first grounding transistor switch that selectively couples said first write select line to a reference potential and said second write means comprises a second grounding transistor switch that selectively couples said second write select line to said reference potential.

6. In a bipolar random access memory as claimed in claim 5, the improvement comprising current sink means coupled to receive current flowing in said select bit lines, bipolar select bit transistor means for each select bit line each of which comprises a first collector-emitter path coupled in series with one of said collector-emitter paths of said first and second bipolar transistors of said sense amplifier means to said current sink means and a second collector-emitter path coupled to one of two write select lines, first write means capable of writing a logical "1" into a selected memory cell means coupled to one of said write select lines and second write means capable of writing a logical "0" into a selected memory cell coupled to the other of said write select lines.

7. In a bipolar random access memory as claimed in claim 5 the improvement wherein said first and second clamping means comprise diode means.

8. In a bipolar random access memory as claimed in claim 7, the improvement comprising current sink means coupled to receive current flowing in said select bit lines, bipolar select bit transistor means for each select bit line each of which comprises a first collector-emitter path coupled in series with one of said collector-emitter paths of said first and second bipolar transistors of said sense amplifier means to said current sink means and a second collector-emitter path coupled to one of two write select lines, first write means capable of writing a logical "1" into a selected memory cell means coupled to one of said write select lines and second write means capable of writing a logical "0" into a selected memory cell coupled to the other of said write select lines.

9. Sense amplifier means for a bipolar random access memory comprising memory cells arranged in a column and having a pair of bit lines for said column of memory cells and a pulse source, comprising first and second diode means, a first bipolar transistor having its collector-emitter path coupled to a first bit line of said pair of bit lines, and a base coupled to said first diode means which is coupled to a second bit line of said pair of bit lines, a second bipolar transistor having its collector-emitter path coupled to said second one of said bit lines and a base coupled to said second diode means which is coupled to said first one of said bit lines, said collectors of both of said bipolar transistor being coupled to provide output signals, impedance means coupled to said pulse source and to both of said bases of said bipolar transistors and current sink means coupled to both of said select bit lines, said diode means being connected so as to be forward-biased when the base-emitter junction of the transistor means to which said diode means is coupled is also forward biased.

10. Write means for a bipolar random access memory comprising current sink means, memory cells arranged in columns and having a pair of bit lines for each column of memory cells, said current sink means, coupled to said bit lines, comprising first control means that comprises a first current path coupled between said current sink means and one of said bit lines of said pair of bit lines, and a second current path, first write means capable of writing a logical "1" into a selected memory cell coupled to said second current path coupled to selectively interrupt or allow current flow in said second current path coupled to said one of said bit lines, second control means that comprises a third current path coupled between said current sink means and the other of said bit lines of said pair of bit lines, and a fourth current path coupled to said other of said bit lines, second write means capable of writing a logical "0" into a selected memory cell coupled to said fourth current data coupled to selectively interrupt or to allow current flow in said fourth current path and bit line selector means coupled to said first and second control means for controlling if a logical "1" or a logical "0" is to be written into said selected memory cell.

11. Write means as claimed in claim 10 wherein said control means each comprise first and second bipolar transistors, said first and second current paths are collector-emitter paths from a common point and said third and fourth current paths are collector-emitter paths to said first and second write means, respectively.

12. Write means as claimed in claim 11 wherein said first write means and said second write means comprise third and fourth bipolar transistors that have their collector-emitter paths coupled between a reference potential and said third and fourth current paths, respectively.

* * * * *

UNITED STATES PATENT AND TRADEMARK OFFICE
CERTIFICATE OF CORRECTION

PATENT NO. : 4,899,311
DATED : February 6, 1990
INVENTOR(S) : Richard J. Petschauer, Robert J. Bergman It is certified that error appears in the above-identified patent and that said Letters Patent is hereby corrected as shown below:

Column 4, line 68, "and" should be -- said -- .

Signed and Sealed this

Twenty-fifth Day of December, 1990

Attest:

HARRY F. MANBECK, JR.

Attesting Officer

Commissioner of Patents and Trademarks